United States Patent
Anderson et al.

(10) Patent No.: US 6,891,239 B2
(45) Date of Patent: May 10, 2005

(54) INTEGRATED SENSOR AND ELECTRONICS PACKAGE

(75) Inventors: Richard S. Anderson, Seabrook, NH (US); James H. Connelly, Weymouth, MA (US); David S. Hanson, West Newbury, MA (US); Joseph W. Soucy, Winchester, MA (US); Thomas F. Marinis, Haverhill, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 0 days.

(21) Appl. No.: 10/374,400

(22) Filed: Feb. 26, 2003

(65) Prior Publication Data

US 2004/0007750 A1 Jan. 15, 2004

Related U.S. Application Data

(60) Provisional application No. 60/362,367, filed on Mar. 6, 2002.

(51) Int. Cl.[7] .............................................. H01L 27/14
(52) U.S. Cl. ........................ 257/414; 257/704; 257/710; 257/774; 73/756; 361/761; 264/161
(58) Field of Search ................................. 257/704, 710, 257/774; 73/756; 361/761; 264/161

(56) References Cited

U.S. PATENT DOCUMENTS

| | | | | |
|---|---|---|---|---|
| 6,333,856 B1 | * | 12/2001 | Harju | 361/761 |
| 6,401,545 B1 | * | 6/2002 | Monk et al. | 73/756 |
| 6,528,875 B1 | * | 3/2003 | Glenn et al. | 257/704 |
| 6,633,385 B2 | * | 10/2003 | Trepanier | 356/450 |

* cited by examiner

Primary Examiner—David Nelms
Assistant Examiner—Mai-Huong Tran
(74) Attorney, Agent, or Firm—Iandiorio & Teska (57) ABSTRACT

An integrated sensor and electronics package wherein a micro-electromechanical sensor die is bonded to one side of the package substrate, one or more electronic chips are bonded to an opposite side of the package substrate, internal electrical connections run from the sensor die, through the package substrate, and to the one or more electronic chips, and input/output connections on the package substrate are electrically connected to one or more of the electronic chips.

24 Claims, 5 Drawing Sheets

INTEGRATED SENSOR AND ELECTRONICS PACKAGE

RELATED APPLICATIONS

This application claims priority of U.S. Provisional Application No. 60/362,367 filed Mar. 6, 2002.

FIELD OF THE INVENTION

This invention relates to an integrated sensor and electronics package.

BACKGROUND OF THE INVENTION

A complete accelerometer typically includes three microelectromechanical (MEM) dies each mounted in a ceramic leadless chip carrier package forming a sensor chip mounted on a printed circuit board. Application specific integrated circuit (ASIC) chips, one for controlling each sensor die, are also mounted on the printed circuit board as are digital gate array chips and decoupling capacitor chips. Typically, there are numerous electrical interconnections between each sensor chip and each ASIC chip and many (a hundred or more) electrical interconnections between each ASIC chip and each digital gate array chip.

Those skilled in the art understand that the sensor chip packages must be mounted in close proximity to the respective ASIC chips and that the digital gate array chips must be mounted in close proximity to their respective ASIC chips to minimize the length of the electrical interconnections therebetween and thereby reduce parasitic capacitance and noise susceptibility.

Thus, it is conventional to place the ceramic leadless sensor chip carrier packages on one side of a printed circuit board and mount the ASIC chips via ball grid arrays on the other side of the printed circuit board opposite each ceramic leadless sensor chip carrier package. The digital gate array chips are also mounted to one side of the printed circuit board as are the decoupling capacitor chips. Wire bonds, the printed circuit board circuitry, and vias through the printed circuit board structure provide the required electrical interconnections.

As the sensors are made more sensitive, however, parasitic capacitance and noise are still problems.

BRIEF SUMMARY OF THE INVENTION

It is therefore an object of this invention to further reduce the path length of the electrical interconnections associated with sensors and their controlling electronics to thereby reduce parasitic capacitance and noise susceptibility.

It is a further object of this invention to reduce the number of electrical interconnections associated with various kinds of sensors and their controlling electronics.

It is a further object of this invention to provide a compact integrated sensor and electronics package.

It is a further object of this invention to provide a complete accelerometer or gyroscope system with better performance.

This invention results from the realization that an integrated sensor and electronics package is effected by mounting the sensor die directly on one side of the substrate of a package and stacking the ASIC and digital gate array chips on the opposite side of the substrate package to eliminate entirely the prior art ceramic leadless sensor chip carrier and the electrical interconnections between the sensor die and the ceramic leadless sensor chip carrier and also to greatly reduce the length of the electrical interconnections between the ASIC chip and the digital gate array chip and also between the sensor chip and the ASIC chip.

This invention features an integrated sensor and electronics package comprising a package substrate, a microelectromechanical sensor die bonded to one side of the package substrate, one or more electronic chips bonded to an opposite side of the package substrate, internal electrical connections running from the sensor die, through the package substrate, and to the one or more electronic chips, and input/output connections on the package substrate electrically connected to at least one or more of the electronic chips.

In one embodiment, the package substrate is made of a high temperature co-fired ceramic material or a low temperature co-fired ceramic material. In another embodiment, the package substrate is a laminate structure.

Preferably, the integrated package further includes a cavity in the substrate and the sensor die is located in the cavity. A typical sensor die includes a sensor substrate, a microelectromechanical structure machined from the substrate, and a cap secured to the sensor substrate covering the microelectromechanical structure. The cap may include electrical connections therethrough. In one embodiment, the cap is attached to the package substrate. In another embodiment, the sensor substrate is bonded to the package substrate.

In one example, the microelectromechanical structure is configured as a gyroscope or accelerometer and there are at least two electronic chips: an application specific integrated circuit chip for controlling the microelectromechanical sensor die and a digital gate array chip for processing the output of the application specific integrated circuit chip. In one embodiment, the application specific integrated circuit chip is bonded to the package substrate and the digital gate array chip is bonded to the application specific integrated circuit chip. The digital gate array chip is wire bonded to the application specific integrated circuit chip and the application specific integrated circuit chip is wire bonded to the package substrate. Further included may be at least one de-coupling capacitor chip mounted on the package substrate for buffering signals to and from the application specific integrated circuit chip. Typically, the de-coupling capacitor chip is a surface mount chip.

In other examples, the microelectromechanical structure is configured as an optical sensor and the cap includes a window, the microelectromechanical structure is configured as a pressure sensor and the cap includes an opening therethrough, or the microelectromechanical structure is configured as chemical or biological agent detector and the cap includes an opening therethrough.

Typically, the input/output connections are solder balls. Further included may be potting material encapsulating the one or more electronic chips, a cover over the one or more electronic chips, and/or a shield over the microelectromechanical sensor die.

A complete inertial measurement system in accordance with this invention features a printed circuit board and one or more integrated sensor and electronics packages mounted to the printed circuit board. Each integrated sensor package includes a package substrate, a microelectromechanical sensor die bonded to one side of the package substrate, one or more electronic chips bonded to an opposite side of the package substrate, internal electrical connections running from the sensor die, through the package substrate and to the one or more electronic chips, and input/output connections on the package substrate electrically connected to one or more of the electronic chips and to the printed circuit board.

The sensors may be configured as in-plane sensors or as out-of-plane sensors In one example, there are three integrated packages, two having sensors configured as in-plane sensors and one configured as an out-of-plane sensor.

This invention features an inertial measurement system comprising a printed circuit board and a plurality of integrated sensor and electronic packages mounted to the printed circuit board, each integrated package including a package substrate with a cavity on a first side thereof, a microelectromechanical die sensor located in the cavity and bonded to the package substrate, on or more electronic chips bonded to an opposite side of the package substrate, internal electrical connections running from the sensor die, through the package substrate, and to the one or more electronic chips, and input/output connections on the first side of the package substrate electrically connected to one or more of the electronic chips and to the printed circuit board.

Another integrated sensor and electronics package comprises a package substrate including a cavity in one surface thereof, a micro-electromechanical sensor die including a sensor substrate and a cap sealed to the sensor substrate, the cap received in the cavity of the package substrate, at least two stacked electronic chips bonded to an opposite side of the package substrate, internal electrical connections running from the sensor die, through the cap, through the package substrate, and to the one or more electronic chips, and input/output connections adjacent the cavity of the package substrate and electrically connected to one or more of the electronic chips.

One example of an integrated sensor and electronics package comprises a package substrate including a cavity in one surface thereof, a micro-electromechanical sensor die including a sensor substrate and a cap sealed to the sensor substrate, the sensor substrate bonded in the cavity of the package substrate, at least two stacked electronic chips bonded to an opposite side of the package substrate, internal electrical connections running from the sensor die, through the cap, through the package substrate, and to the one or more electronic chips, and input/output connections adjacent the cavity package substrate and electrically connected to one or more of the electronic chips.

Another exemplary integrated sensor and electronics package comprises a package substrate, a microelectromechanical sensor die including a sensor substrate, a microelectromechanical structure configured as an accelerometer or gyroscope machined from the substrate, and a cap covering the microelectromechanical structure, an application specific integrated circuit chip for controlling the microelectromechanical structure bonded to an opposite side of the package substrate, a digital gate array chip bonded to the application specific integrated circuit chip, internal electrical connections running from the sensor die, through the package substrate, and to the application specific integrated circuit chip and running from the application specific integrated circuit chip to the digital gate array chip, and input/output connections on the package substrate electrically connected to the application specific integrated circuit chip through the package substrate.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENTS

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings.

Figure 1:
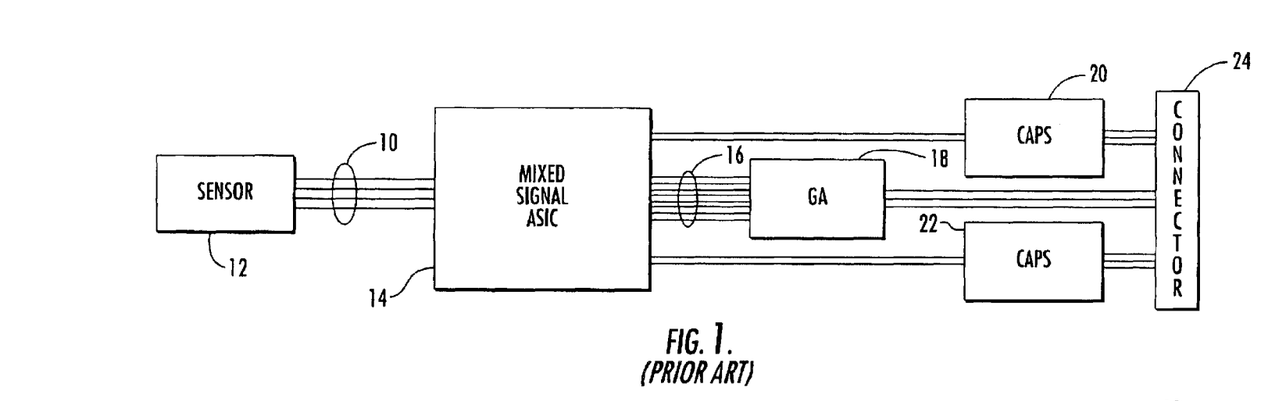
FIG. 1 is a block diagram showing the primary subsystems associated with a prior art sensor.

As discussed in the Background section above, there may be eight to twelve electrical interconnections 10, FIG. 1 between sensor 12 and mixed signal ASIC chip 14 and many (one hundred or more) electrical interconnections 16 between ASIC 14, and digital gate array chip 18. Also shown in FIG. 1 are decoupling capacitor chips 20 and 22, the electrical connections between decoupling capacitor chips 20 and 22 and ASIC 14, and connector 24 electrically connected to decoupling capacitors 20, 22, and digital gate array chip 18.

Figure 2:
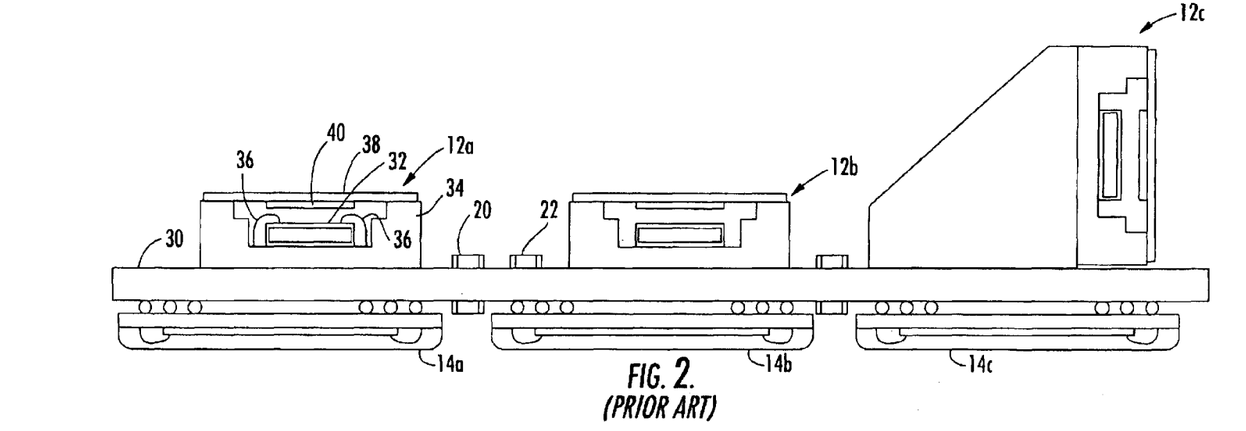
FIG. 2 is a schematic cross-sectional view of a printed circuit board with three sensor dice housed in ceramic leadless chip carriers and mounted on one side of a printed circuit board and three ASIC chips mounted on the opposite side of the circuit board in accordance with the prior art.

Those skilled in the art have attempted to minimize the length of all of the electrical interconnections shown in FIG. 1 to reduce parasitic capacitance and noise susceptibility by locating ASICs 14a, 14b, and 14c, FIG. 2 on printed circuit board 30 directly opposite sensors 12a, 12b, and 12c. The digital gate array chips are also mounted to printed circuit board 30 but not shown in FIG. 2. FIG. 2 does show decoupling capacitors 20 and 22 mounted to printed circuit board 30. Typically, each sensor as shown for sensor 12a includes sensor die 32 bonded to ceramic leadless chip carrier 34 and electrically connected thereto by wire bonds 36. One sensor die 32 typically includes a silicon layer anodically bonded to a glass substrate and structure including a proof mass and its associated support elements are machined out of the silicon layer using microelectromechanical (MEMs) techniques. The glass substrate is bonded to ceramic leadless chip carrier 34 as shown in FIG. 2 and the MEMs device is protected by cover 38 and getter material 40.

As discussed in the Background section above, however, the output signals from the MEMs structure are very low and, as the MEMs structures increase in sensitivity, parasitic capacitance and noise are still concerns for the design of FIG. 2.

In this invention, ceramic leadless chip carrier package 34 is eliminated in its entirety as are wire bonds 36. Instead, the gate array chip, the ASIC chip, and the sensor die are placed in extremely close proximity all within a single integrated package 50, FIG. 3.

Figure 3:
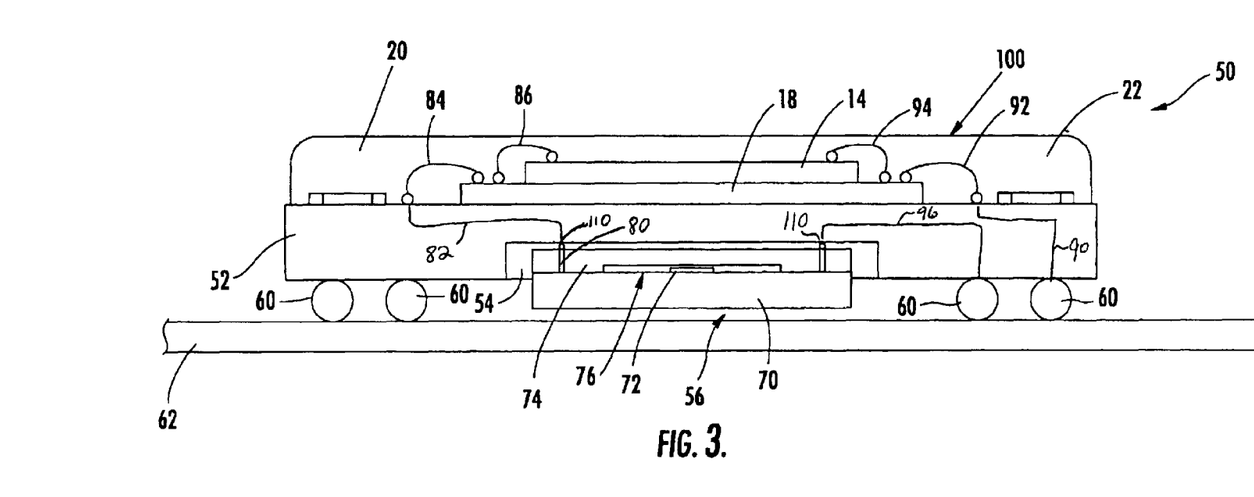
FIG. 3 is a schematic cross-sectional view showing one embodiment of the integrated sensor and electronics package of the subject invention.

Package 50 includes package substrate 52 preferably with cavity 54 formed therein. In one example, substrate 52 is a ceramic ball grid array substrate made of low or high temperature co-fired ceramic material. MEMs sensor die 56 is bonded to one side of package substrate 52 in cavity 54 as shown to provide clearance between the bottom of die 56 and input/output solder ball connections 60 which electrically connect package 50 to printed circuit board 62.

Sensor die 56 typically includes glass sensor substrate 70, silicon MEMs structure 72 thereon, and silicon cap 74 secured to substrate 70 covering MEMs structure 72 and forming sensor cavity 76.

Digital and/or analog electronic chips such as ASIC chip 14 and configurable gate array (CGA) chip 18 are stacked as shown and bonded to the opposite side of package substrate 52 as are decoupling capacitor surface mount chips 20 and 22.

Internal electrical connections run from sensor die 56, through substrate 52, and to chips 14 and 18 as shown at 80, 82, 84, and 86. Input/output connections 60 on package substrate 52 adjacent cavity 54 are electrically connected to one or more of the chips 14 and 18 as shown at 90, 92, and 94 and/or connected to sensor chip 56 as shown at 96. For the sake of clarity, not all of the electrical connections are shown in all of the figures. Potting material 100 encapsulates chips 14, 18, 20, and 22 and also wire bonds 84, 86, 92, and 94.

The resulting chip scale package 50 comprises sealed heterogeneous integration process MEMs sensor 56 flip chip attached in the cavity 54 of substrate 52. Chips 14 and 18 are epoxy mounted and wire bonded to substrate 52. After potting, fine pitch (0.02") solder balls 60 are added to produce an integrated sensor chip scale package with a ball grid array mounting footprint for standard surface mounting technology printed circuit board assembly processes.

The result is the elimination of leadless chip carrier package 34, FIG. 2, and instead, the full integration of the sensor and its controlling circuitry in a single package which can be as small as 0.433 inches wide and 0.097 inches tall. These dimensions are approximately the same dimensions as prior art leadless chip carrier package 34, FIG. 2 which had no controlling electronics associated with it.

The resulting architecture of the integrated package of the subject invention thus inherently occupies less overall volume making it more attractive for use in hand held consumer electronic devices. Integrated package 50, FIG. 3 also increases performance due to the shortened signal paths. Module assembly is greatly simplified because there are fewer electronic parts to assemble to the printed circuit board which in turn reduces manufacturing costs and also increases reliability. The package of the subject invention can be manufactured and assembled using standard high volume facilities and equipment used throughout the commercial and military electronics industry. The integrated MEM sensor and electronic packaging approach is ideally suited to high volume commercial manufacturing processes and enables small size, low cost, high performance integrated INS/GPS inertial navigation systems to be realized in the portable electronics consumer marketplace. Applications include handheld personal navigation systems, cellular phones, marine and automotive navigation systems, and small satellites.

In the embodiment of FIG. 3, cap 74 of sensor die 56 is secured in cavity 54 by ball grid solder balls 110 each five mil in diameter and made of high temperature solder. Cap 80 includes corresponding vias therethrough as shown which electrically interconnect solder balls 110 with the metalization on sensor substrate 70.

Figure 4:
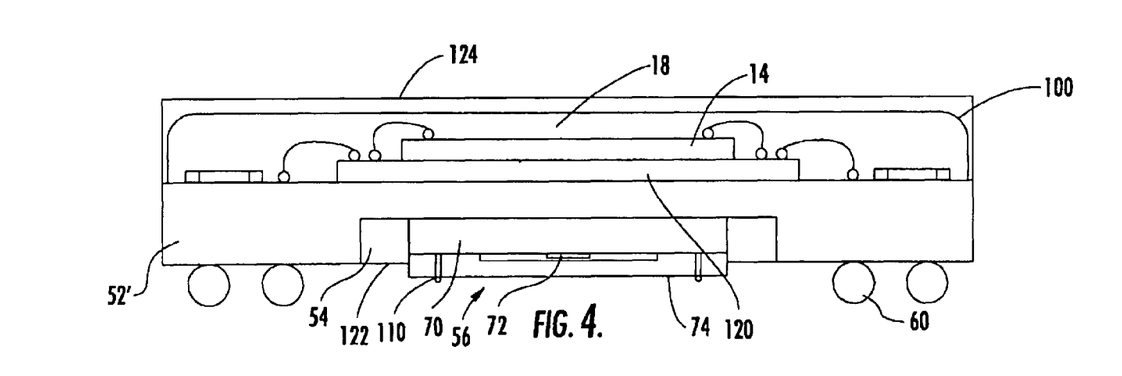
FIG. 4 is a schematic cross-sectional view showing another embodiment of the integrated sensor and electronics package of the subject invention.

In FIG. 4, however, sensor glass substrate 70 is bonded via silicone rubber layer 120 to cavity 54 and package substrate 52' is now a typical laminate ball grid array substrate array substrate 0.04 inches thick. Kapton flex strips 122 electrically interconnect five mil solder balls 110 to substrate 52. FIG. 4 also shows the addition of cover 124.

Figure 5:
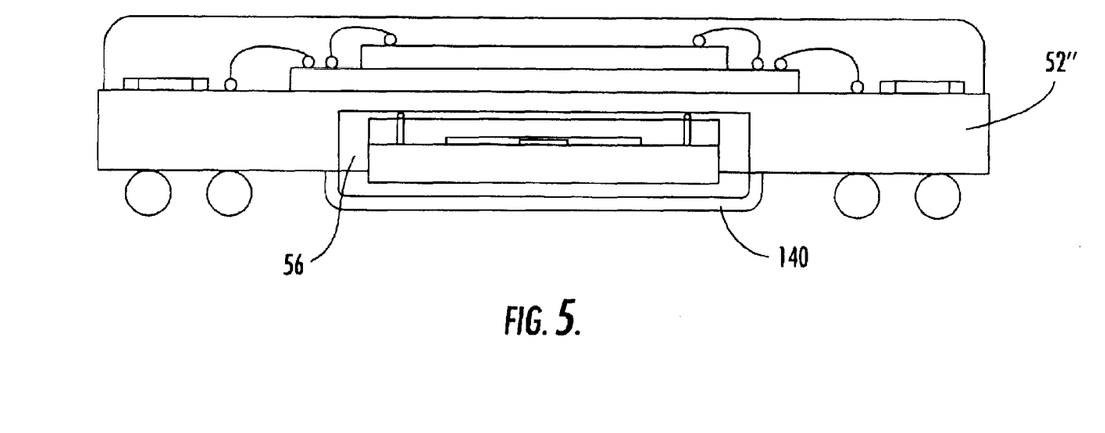
FIG. 5 is a schematic cross-sectional view showing still another embodiment of the integrated sensor and electronics package of the subject invention.

FIG. 5 shows the use of a lower coefficient of thermal expansion laminate 52" as the package substrate (e.g., "thermount") and the addition of five mil thick hermetic shield 140 soldered to substrate 52" protecting sensor die assembly 56.

Figure 6:
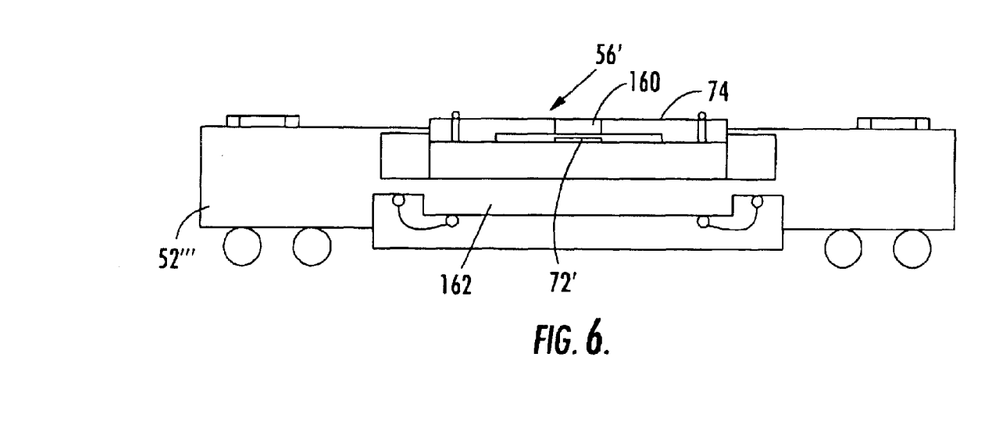
FIG. 6 is a schematic view showing one example of an integrated sensor and electronics package in accordance with the subject invention wherein the sensor is chemical or biological agent sensor.

Thus far, the MEMs sensors have been characterized as accelerometers or gyroscopes but this is not a limitation of the subject invention. FIG. 6 shows a MEMs chip 56' configured as a chemical or biological agent detector wherein cap 74 includes opening 160 therein to allow the MEMs sensing structure 72' to be responsive to various chemical compounds or biological agents. Also, package substrate 52''' includes two cavities as shown, one for receiving sensor die 56' and the other for receiving integrated circuit chip 162 which controls the operation of sensor die 56'.

Figure 7:
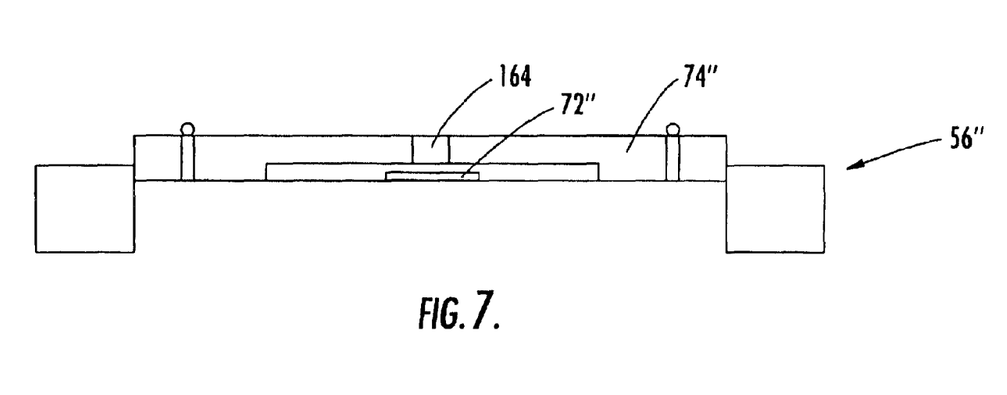
FIG. 7 is a schematic cross-sectional view showing a pressure sensor in accordance with the subject invention.
Figure 8:
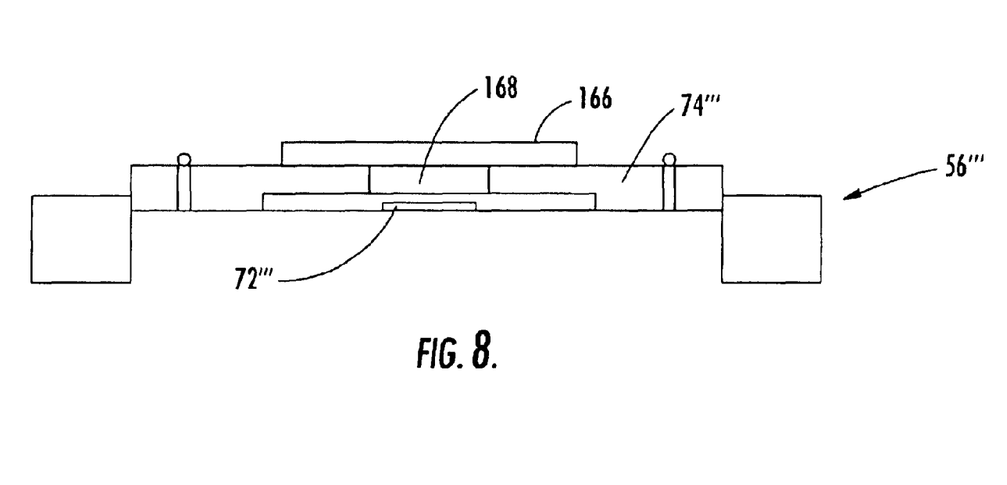
FIG. 8 is a schematic cross-sectional view showing an optical sensor in accordance with the subject invention.

Another possible sensor include pressure sensor 56", FIG. 7 with cap opening 164 allowing MEMs structure 72" which is configured to sense pressure changes access to pressure differentials. Sensor 56''', FIG. 8, in turn, is an optical sensor with window 166 covering opening 168 in cap 74''' allowing MEMs structure 72''' configured as an optical sensor to receive incident radiation.

Figure 9:
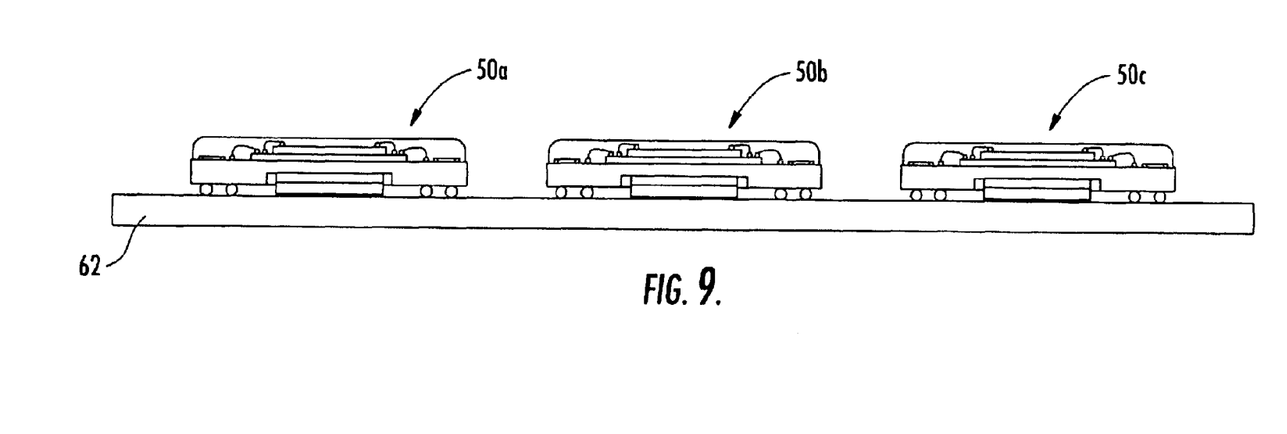
FIG. 9 is a schematic cross-sectional view showing three integrated sensor and electronics packages mounted on a printed circuit board in accordance with the subject invention.

A complete inertial measurement system in accordance with this invention includes printed circuit board 62, FIG. 9 and integrated packages 50a–50c as discussed with reference to FIG. 3 mounted on printed circuit board 62 via ball grid arrays as shown. Sensor packages 50a and 50b may be configured as in-plane sensors while sensor package 50c may be configured as an out-of-plane sensor.

Figure 10:
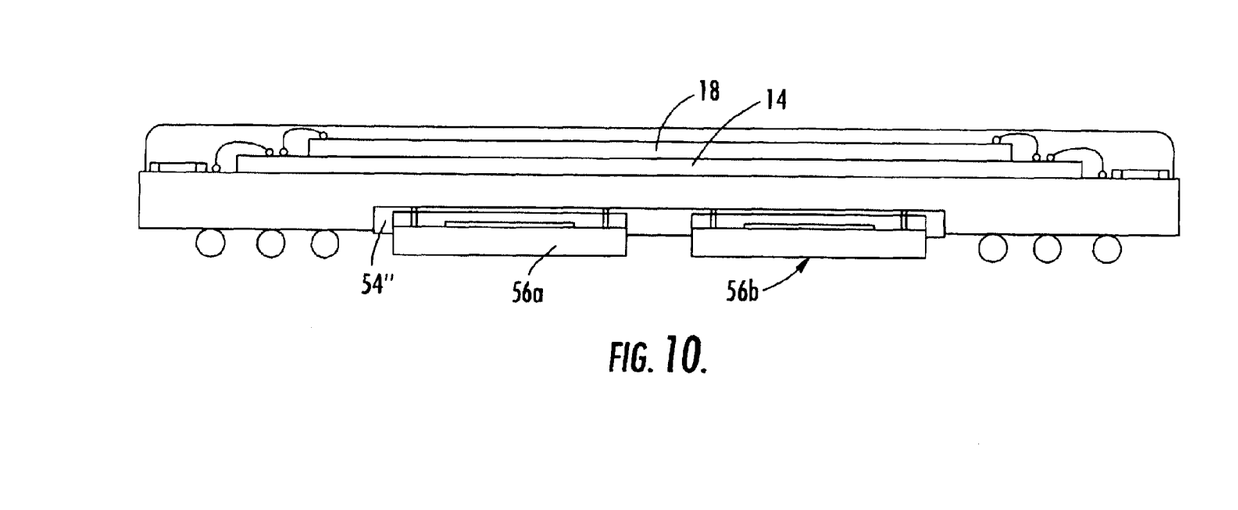
FIG. 10 is a schematic view showing an example of an integrated sensor and electronics package in accordance with the subject invention wherein multiple sensors are included in the integrated package.

In FIG. 10, package substrate cavity 54" is sized to accommodate two or more sensor dies 56a and 56b and a third sensor die (not shown), two in-plane and one out-of-plane configuration. ASIC 14 and configurable gate array chip 18 control all three sensors.

The result, in any embodiment, is the reduction of the path length of the electrical interconnections associated with the sensors and their controlling electronics resulting in reduced parasitic capacitance and noise susceptibility. In addition, the number of electrical interconnections is reduced and a more compact integrated sensor and electronics package featuring better system performance is realized by mounting the sensor die directly on one side of the package substrate instead of within a leadless chip carrier and by stacking the ASIC and digital gate array chips on the opposite side of the substrate package.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical or electrical interconnection. Moreover, any embodiments disclosed in the subject application are not to be taken as the only possible embodiments.

Other embodiments will occur to those skilled in the art and are within the following claims:

What is claimed is:

1. An integrated sensor and electronics package comprising:
   a package substrate;
   a micro-electromechanical sensor die bonded to one side of the package substrate;
   one or more electronic chips bonded to an opposite side of the package substrate;
   internal electrical connections running from the sensor die, through the package substrate, and to the one or more electronic chips; and
   input/output connections on the package substrate electrically connected to at least one or more of the electronic chips.

2. The integrated package of claim 1 in which the package substrate is made of a high temperature co-fired ceramic material or a low temperature co-fired ceramic material.

3. The integrated package of claim 1 in which the package substrate is a laminate structure.

4. The integrated package of claim 1 further including a cavity in the substrate, the sensor die located in the cavity.

5. The integrated package of claim 1 in which the sensor die includes:
   a sensor substrate,
   a microelectromechanical structure machined from the substrate, and
   a cap secured to the sensor substrate covering the microelectromechanical structure.

6. The integrated package of claim 5 in which the cap includes electrical connections therethrough.

7. The integrated package of claim 5 in which the cap is attached to the package substrate.

8. The integrated package of claim 5 in which the sensor substrate is bonded to the package substrate.

9. The integrated package of claim 5 in which the microelectromechanical structure is configured as a gyroscope or accelerometer.

10. The integrated package of claim 9 in which there are at least two electronic chips, an application specific integrated circuit chip for controlling the microelectromechanical sensor die and a digital gate array chip for processing the output of the application specific integrated circuit chip.

11. The integrated package of claim 10 in which the application specific integrated circuit chip is bonded to the package substrate and the digital gate array chip is bonded to the application specific integrated circuit chip.

12. The integrated package of claim 11 in which the digital gate array chip is wire bonded to the application specific integrated circuit chip and the application specific integrated circuit chip is wire bonded to the package substrate.

13. The integrated package of claim 10 further including at least one de-coupling capacitor chip mounted on the package substrate for buffering signals to and from the application specific integrated circuit chip.

14. The integrated package of claim 13 in which the de-coupling capacitor chip is a surface mount chip.

15. The integrated package of claim 5 in which the microelectromechanical structure is configured as an optical sensor and the cap includes a window.

16. The integrated package of claim 5 in which the microelectromechanical structure is configured as a pressure sensor and the cap includes an opening therethrough.

17. The integrated package of claim 5 in which the microelectromechanical structure is configured as chemical or biological agent detector and the cap includes an opening therethrough.

18. The integrated package of claim 1 in which the input/output connections are solder balls.

19. The integrated package of claim 1 further including potting material encapsulating the one or more electronic chips.

20. The integrated package of claim 1 further including a cover over the one or more electronic chips.

21. The integrated package of claim 1 further including a shield over the microelectromechanical sensor die.

22. An integrated sensor and electronics package comprising:
   a package substrate including a cavity in one surface thereof;
   a micro-electromechanical sensor die including a sensor substrate and a cap sealed to the sensor substrate, the cap received in the cavity of the package substrate;
   at least two stacked electronic chips bonded to an opposite side of the package substrate;
   internal electrical connections running from the sensor die, through the cap, through the package substrate, and to the one or more electronic chips; and
   input/output connections adjacent the cavity of the package substrate and electrically connected to one or more of the electronic chips.

23. An integrated sensor and electronics package comprising:
   a package substrate including a cavity in one surface thereof;
   a micro-electromechanical sensor die including a sensor substrate and a cap sealed to the sensor substrate, the sensor substrate bonded in the cavity of the package substrate;
   at least two stacked electronic chips bonded to an opposite side of the package substrate;
   internal electrical connections running from the sensor die, through the cap, through the package substrate, and to the one or more electronic chips; and
   input/output connections adjacent the cavity package substrate and electrically connected to one or more of the electronic chips.

24. An integrated sensor and electronics package comprising:
   a package substrate;
   a micro-electromechanical sensor die including a sensor substrate, a microelectromechanical structure configured as an accelerometer or gyroscope machined from the substrate, and a cap covering the microelectromechanical structure;

an application specific integrated circuit chip for controlling the microelectromechanical structure bonded to an opposite side of the package substrate;

a digital gate array chip bonded to the application specific integrated circuit chip;

internal electrical connections running from the sensor die, through the package substrate, and to the application specific integrated circuit chip and running from the application specific integrated circuit chip to the digital gate array chip; and input/output connections on the package substrate electrically connected to the application specific integrated circuit chip through the package substrate.

* * * * *